(12) United States Patent
Tao et al.

(10) Patent No.: US 7,504,155 B2
(45) Date of Patent: Mar. 17, 2009

(54) SUPPRESSION OF CHEMICAL REACTIVITY ON SEMICONDUCTOR SURFACES

(75) Inventors: Meng Tao, Colleyville, TX (US); Wiley P. Kirk, Garland, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 41 days.

(21) Appl. No.: 10/822,343

(22) Filed: Apr. 12, 2004

(65) Prior Publication Data

US 2004/0266141 A1 Dec. 30, 2004

Related U.S. Application Data

(63) Continuation-in-part of application No. 10/377,015, filed on Feb. 28, 2003, now Pat. No. 6,784,114.

(51) Int. Cl.
*B32B 9/00* (2006.01)
(52) U.S. Cl. .................. 428/446; 428/450; 428/702
(58) Field of Classification Search .................. None
See application file for complete search history.

(56) References Cited

U.S. PATENT DOCUMENTS

| | | | |
|---|---|---|---|
| 5,760,462 A | 6/1998 | Barron et al. | |
| 5,943,568 A | 8/1999 | Fujii et al. | |
| 6,143,072 A * | 11/2000 | McKee et al. | 117/108 |
| 6,419,742 B1 * | 7/2002 | Kirk et al. | 117/84 |
| 6,483,172 B1 | 11/2002 | Cote et al. | |

OTHER PUBLICATIONS

R.M. Tromp, R.J. Hamers, and J.E. Demuth, Si(001) dimmer structure observed with scanning tunneling microscopy, Phys. Rev. Lett., 1985, 1303, 55.

E. Kaxiras, Semiconductor-surface restoration by valence-mending absorbates: Application to Si(100):S and Si(100):Se, Physical Review B, 1991, 6324, 43.

H. Metzner, TH. Haln, and J.-H. Bremer, Structure of sulfur-terminated silicon surfaces, Surf. Sci., 1997, 377-371-374, 379.

J.J. Boland, Structure of the H-saturated Si(100) surface, Phys. Rev. Lett., 1990, 3325, 65.

M. Tao and L.P. Hunt, The thermodynamic behavior of the Si-H system and its role in Si-CVD from $SiH_4$, J. Electrochem. Soc., 1992, 806, 139.

J.E. Northrup, Structure of Si(100)H: Dependence on the H chemical potential, Phys. Rev. B, 1991, 1419, 44.

B.S. Meyerson, F.J. Himpsel, and K. J. Uram, Bistable conditions for low-temperature silicon epitaxy, Appl. Phys. Lett., 1990, 1034, 57.

J.W. Lyding, T.-C Shen, J.S. Hubacek, J.R. Tucker, and G.C. Abeln, Nanoscale patterning and oxidation of H-passivated Si(100)-2x1 surfaces with an ultrahigh vacuum scanning tunneling microscope, Appl. Phys. Lett., 1994, 2010, 64.

(Continued)

*Primary Examiner*—Timothy M Speer
(74) *Attorney, Agent, or Firm*—Chowdhury & Georgakis, PC

(57) ABSTRACT

The present invention relates generally to compositions, kits and methods of providing improved semiconductor surfaces free of dangling bonds and free of strained bonds. One method provides for preventing interfacial reactions between a semiconductor surface and metal or dielectric comprising the steps of preparing a passivated semiconductor surface using a valence-mending agent and depositing a layer of metal or dielectric on the valence-mended semiconductor surface. As further described, a semiconductor surface free of interfacial reactions between the surface and a second molecular species may include a semiconductor surface with one atomic layer of valence-mending atoms, wherein valence mending occurs after introducing the semiconductor surface to a passivating agent. The present invention also includes a kit for preventing interfacial reactions from occurring on a semiconductor surface comprising a passivating agent and an instructional manual.

8 Claims, 9 Drawing Sheets

OTHER PUBLICATIONS

T.-C Shen, C. Wang, G.C. Abeln, J.R. Tucker, J.W. Lyding, PH. Avouris, and R.E. Walkup, Atomic-scale desorption through electronic and vibrational excitation mechanisms, Science, 1995, 1590, 268.

J.W. Lyding, UHV STM nanofabrication: progress, technology spin-offs, and challenges, Proceedings of the IEEE, 1997, 589, 85.

T.-C. Shen, C. Wang, and J.R. Tucker, Al nucleation on monohydride and bare Si (001) surfaces: atomic scale patterning, Phys. Rev. Lett., 1997, 1271, 78.

I. Lyubinetsky, Z. Dohnalek, W.J. Choyke, and J.T. Yates, Jr., $Cl_2$ dissociation on Si(100)-(2x1): A statistical study by scanning tunneling microscopy, Phys. Rev. B, 1998, 7950, 58.

M. Chander, Y.Z. Li, D. Rioux, and J.H. Weaver, Patterning of Si(100): Spontaneous etching with $Br_2$, Phys. Rev. Lett., 1993, 4154, 71.

The National Technology Roadmap for Semiconductors, Semiconductor Industry Association, 1997.

A. M. Cowley, S. M. Sze, Surface States and Barrier Height of Metal-Semiconductor Systems, J. Appl. Phys, 1965, 3212-3220, 36.

J. P. Lacharme, N. Benazzi, C. A. Sebenne, Compositional and electronic properties of Si(001)2X1 upon diatomic sulfur interaction, Surf. Sci., 1999, 415-419, 433-435.

A. C. Papageorgopoulos, M. Kamaratos, Adsorption and desorption of Se on Si(100)2X1: surface restoration, Surf. Sci., 1999, 415-419, 433-435.

Michaelson, Herbert B., The work function of the elements and its periodicity, J. Appl. Phys., 1977, 4729-33, 48.

Kaxiras, Efthimios, "Semiconductor-surface restoration by valence-mending absorbates: Application to Si(100):S and Si(100):Se," Rapid Communications Physical Review, Mar. 15, 1991, pp. 6824-6827, V 43-8.

\* cited by examiner

A

B

⊕ [011]

A

⊕ [100]

B

A

B

C

D (a)

(b)

SUPPRESSION OF CHEMICAL REACTIVITY ON SEMICONDUCTOR SURFACES

CROSS-REFERENCE TO RELATED APPLICATIONS

This application is a continuation-in-part of U.S. patent application Ser. No. 10/377,015, filed on Feb. 28, 2003, herein incorporated by reference.

BACKGROUND OF THE INVENTION

The present invention relates to improvements for semiconductors, and particularly to compositions, kits, and preparations for providing a passivated semiconductor surface free of dangling bonds and free of strained bonds.

Dangling bonds and strained bonds are an inherent nature of semiconductor surfaces. Dangling and strained bonds cause a variety of problems in the fabrication of solid-state devices on semiconductor substrates. They are responsible for the high chemical reactivity of the surface by acting as reaction sites for chemical reactions and create surface states that cause the observed properties of electronic devices to vary from their design specifications. On a semiconductor surface, dangling bonds adsorb oxygen, water, or carbon dioxide, and a layer of native oxide is formed as soon as the surface is exposed to air. Thus, there remains a need to create a passivated semiconductor surface free of dangling bonds and free of strained bonds Traditionally, the passivation of semiconductor surfaces has been realized with a thin layer of a dielectric, such as silicon dioxide ($SiO_2$) or silicon nitride ($Si_3N_4$) prepared by oxidation, chemical vapor deposition or physical vapor deposition. Unfortunately, the thickness of the passivation layer is typically a few nanometer (nm) to a few micrometers ($\mu m$). As such, the semiconductor surface covered with a dielectric of such a thickness no longer behaves as a semiconducting surface, but an insulating one. Thus, there remains a need to passivate such a surface without changing the conducting nature of the surface.

Other methods that have been used over the years to attempt to reduce or passivate surface states on semiconductor substrates often impede the ability of solid-state devices to behave as they are designed. For example, an alternative method to passivate semiconductor surfaces, hydrogen passivation, often breaks down in air after a short period of time (minutes). This method relies on converting semiconductor-hydrogen bonds from dangling semiconductor bonds, but suffers from steric problems due to the fact that there is insufficient room to break up the dimer bonds and fully hydrogenate the silicon (100) surface. As a result, there are still surface effects that detract from the performance of any semiconductor devices ultimately formed on such a substrate.

With such problems, no current methods effectively suppress silicidation between silicon and metals or suppress surface oxidation on silicon. Therefore, there exists a need for an effective method of passivating a semiconductor while concomitantly minimizing any carry over effects from the passivation itself.

SUMMARY OF THE INVENTION

The present invention provides for a passivated semiconductor surface free of dangling bonds and free of strained bonds. With the present invention the chemical reactivity of the surface is suppressed. Because the thickness of the passivation layer is precisely controlled (generally to one atomic layer, equivalent to at least about one Angstrom thick), the passivated surface is capable of keeping its semiconducting nature.

In one form, the present invention is a method of preventing interfacial reactions between a semiconductor surface and a metal or dielectric comprising the steps of preparing a passivated semiconductor surface using a valence-mending agent and depositing a layer of metal or depositing a dielectric or dielectric precursor on the valence-mended semiconductor surface. The metal is generally selected from those used with semiconductor devices and the dielectric or dielectric precursor may be one that exhibits a high dielectric constant, k, larger than 4. As used herein, a semiconductor surface may be selected from those known to one of ordinary skill in the art, wherein at least one surface is available for preparation and deposition. Similarly, as used herein, a passivating agent is generally a Group VI congener (element), but may include congeners from other Groups. In addition, as used herein, a valence-mended semiconductor surface is one atomic layer thick.

In another form, the present invention is a method of suppressing chemical reactions on a semiconductor surface comprising the steps of preparing a passivated semiconductor surface using a valence-mending agent and suppressing chemical reactions from occurring on the valence-mended semiconductor surface even when it is heated. The method prevents adsorbates that weakly bond to the valence-mended semiconductor surface prior to heating from bonding after heating, such that they desorb with heating. Heating temperatures may include ranges of at least about 100 to 600 degrees Centigrade.

In still another form, the present invention is a method of cleaning a semiconductor surface and/or preventing oxidation on the surface comprising the steps of preparing a passivated semiconductor surface using a valence-mending agent and heating the valence-mended semiconductor surface. Heating cleans the surface without oxidation.

Still another form of the present invention provides a semiconductor surface free of interfacial reactions between the surface and a second molecular species comprising a semiconductor surface with one atomic layer of valence-mending agents, wherein valence mending occurs after introducing the semiconductor surface to a passivating agent. Generally, the second molecular species is one that may be deposited or forms on the surface, including metals, dielectrics, and reactants, such as oxygen, water vapor, carbon, hydrogen, carbon dioxide, carbon monoxide, and combinations thereof. Interfacial reactions may be those that interfere with the semiconductor surface, including oxidation, degradation, condensation, vaporization, adsorption, silicidation, and combinations, thereof.

The present invention also provides for a kit for preventing interfacial reactions from occurring on a semiconductor surface comprising a passivating agent and an instructional manual.

One advantage of the present invention is that the passivation layer formed by the passivating agent is small enough (often about one Angstrom thick) that the semiconductor surface still provides semiconducting behaviors. As presented herein, the passivation is a monolayer that saturates all the dangling bonds and relaxes all the strained bonds on the semiconductor surface such that the surface becomes much less reactive chemically. With the present invention, the passivated semiconductor surface, when in contact with various reactants (e.g., oxygen, water vapor, metals, metal oxides, etc.) suppresses such reactants from reacting with the surface.

Those skilled in the art will further appreciate the above-noted features and advantages of the invention together with other important aspects thereof upon reading the detailed description that follows in conjunction with the drawings.

BRIEF DESCRIPTION OF THE FIGURES

For more complete understanding of the features and advantages of the present invention, reference is now made to the detailed description of the invention along with the accompanying FIGURES, wherein.

DETAILED DESCRIPTION OF THE INVENTION

The invention, as defined by the claims, may be better understood by reference to the following detailed description. The description is meant to be read with reference to the FIGUREs contained herein. This detailed description relates to examples of the claimed subject matter for illustrative purposes, and is in no way meant to limit the scope of the invention. The specific aspects and embodiments discussed herein are merely illustrative of ways to make and use the invention, and do not limit the scope of the invention.

Figure 1:
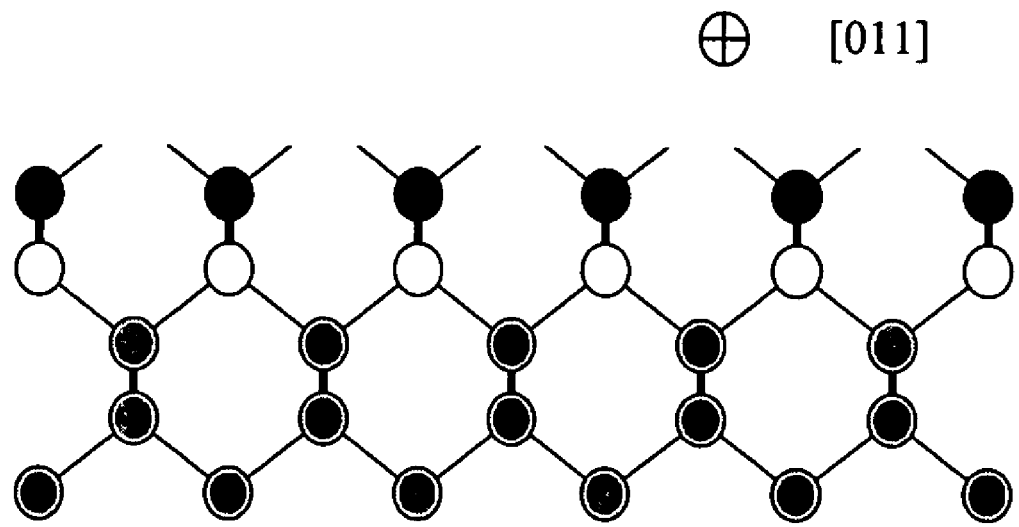
FIG. 1 depicts the atomic structure of a nascent silicon (100) surface with (A) side view into the [011] direction and (B) top view into the [100] direction, wherein dark circles are surface atoms, open circles are second-layer atoms, third, fourth, and fifth layer atoms are gray circles, and each surface atom has two dangling bonds.
Figure 1:
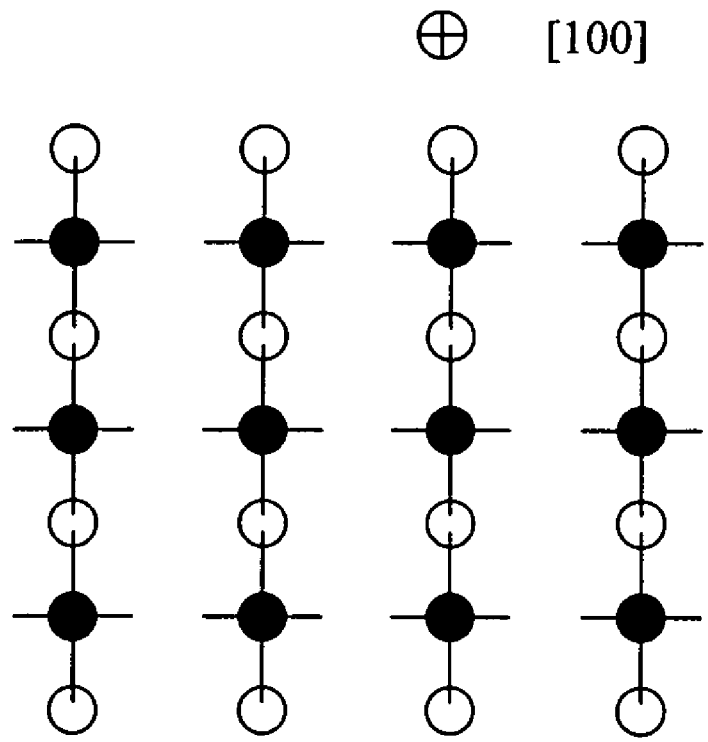

A semiconductor surface is where chemical bonds are broken and dangling bonds are created. For example, each surface atom on the (100) surface of silicon has two dangling bonds, as shown in FIG. 1, which make the surface chemically reactive. When the surface is exposed to air, the dangling bonds quickly react with air and chemically adsorb molecules or species from the air: water ($H_2O$), carbon dioxide ($CO_2$), oxygen ($O_2$), etc. When the surface is in contact with other materials such as metals or metal oxides, interfacial reactions take place, which form an interfacial layer of silicide or oxide with or without heating.

Figure 2:
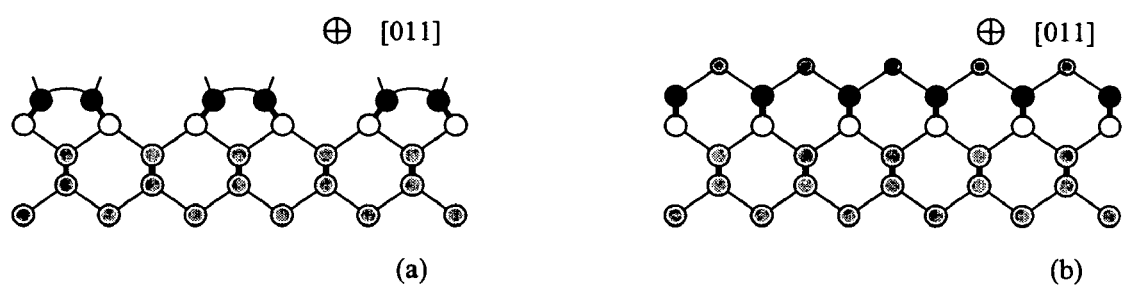
FIG. 2 depicts a side view into the [011] direction of (A) a reconstructed silicon (100) surface and (B) a Group VI-passivated silicon (100) surface, wherein dark circles represent surface silicon atoms, white circles are second layer atoms and gray circles are bulk atoms.

When a clean silicon (100) surface is kept in ultrahigh vacuum, it has little chance for adsorption or reaction with external species. Under such conditions, the surface undergoes reconstruction to reduce its energy. Each atom on a reconstructed silicon (100):2×1 surface has one dangling bond and shares a dimer bond with a neighboring surface atom, as shown in FIG. 2($a$). Electrically, surface states originate from dangling bonds and strained surface bonds (i.e., dimer bonds and back bonds) and often pin the surface Fermi level, causing surface band bending. When a metal is deposited on the silicon (100) surface, surface states (now more appropriately, interface states) pin the interface Fermi level, making the Schottky barrier height less dependent on metal work function and semiconductor electron affinity and instead, the barrier height is controlled by surface states.

Figure 3:
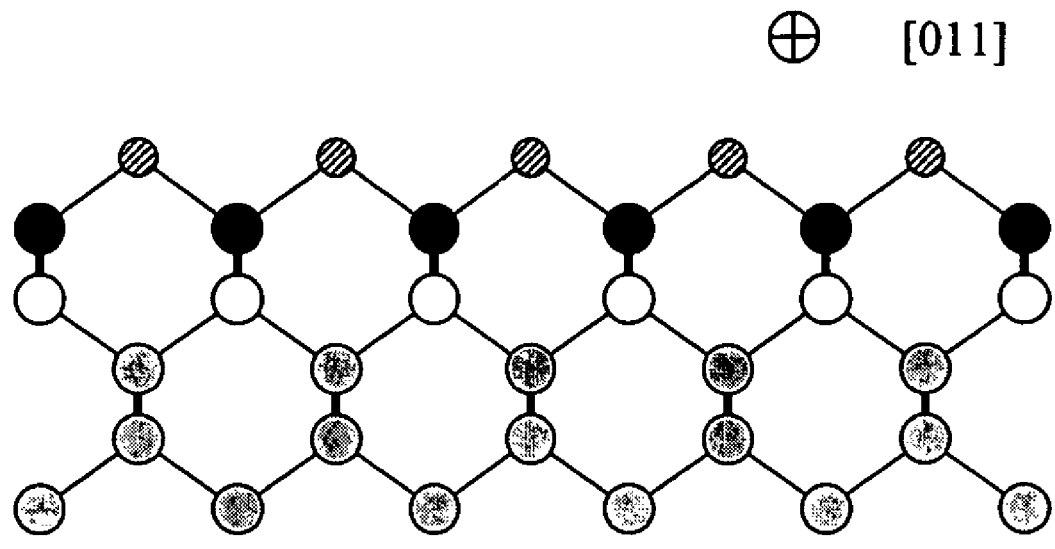
FIG. 3 depicts the atomic structure of a valence-mended silicon (100) surface with a monolayer of sulfur, selenium, or tellurium with (A) side view into the [011] direction and (B) top view into the [100] direction, wherein hatched circles are Group VI atoms and the passivated surface has no dangling bonds.
Figure 3:
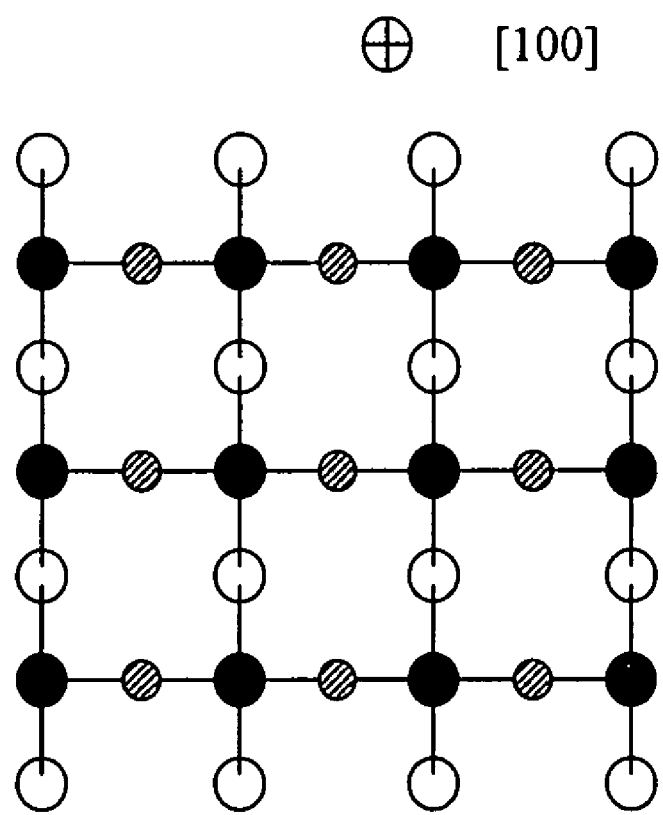

To eliminate dangling bonds on semiconductor surfaces, the present invention provides for a method of preparing a very thin layer of valence-mending atoms on a semiconductor surface. In one embodiment, the thin layer is precisely one atomic layer. For a silicon (100) surface, valence-mending atoms include most of the Group-VI elements, such as sulfur (S), selenium (Se), and tellurium (Te). An example of the atomic structure of a valence-mended silicon (100) surface is shown in FIG. 3.

The concept of "valence-mending" was proposed to eliminate dangling bonds on semiconductor surfaces. For the silicon (100) surface, valence-mending atoms include Group VI atoms sulfur (S), selenium (Se) and tellurium (Te). They can bridge between two surface atoms and nicely terminate dangling bonds and relax strained bonds on silicon (100), as shown in FIG. 2($b$). This structure is often noted as a 1×1 reconstruction. The difficulty with valence mending is controlling the amount of passivating agent that is incorporated so that a new layer of material that significantly interferes with the intrinsic properties of the semiconductor substrate is not built up.

Today, 95% of all semiconductor devices are field effect transistors (FETs). These are not the transistors, however, that Bardeen first demonstrated in 1947. The first example of a solid-state device was a point contact transistor that was less subject to the problems inherent in the formation of an FET. The difficulty in preparing an FET arose from problems caused by surface effects or surface states in the semiconductor material. The surface states were a direct result of dangling bonds on the surface of the semiconductor.

The present invention provides, for example, a method for passivating the surface of a semiconductor without substantially altering the properties of the underlying material. As a result, solid-state devices that have been passivated in accordance with the present invention display greatly lowered Schottky barriers, or alternatively, improved ohmic contacts. Before the use of the present invention, no metal-semiconductor interface has been observed to have a Schottky barrier of less than 0.4 electron volts on n-type silicon. For example, the reported Schottky barrier value of aluminum-silicon contacts is 0.7 electron volts. This is contrasted with the aluminum-silicon contacts in accordance with the present invention that exhibit Schottky barriers of 0.06 to 0.1 electron volts, values much closer to the theoretical value of −0.01 than previously observed. Similarly, chromium-silicon contacts have been reported to have Schottky barriers of 0.61 electron volts. When Cr—Si contacts are prepared in accordance with the present invention the observed barrier is 0.25 electron volts, which is very close to the theoretical barrier height of 0.21 electron volts.

The present invention may also be used to prepare ohmic contacts, i.e., a metal-semiconductor contact, with a negative Schottky barrier, or put another way, no Schottky barrier at all. Both magnesium and titanium contacts with silicon have been reported to display Schottky barriers. When these contacts are prepared on surfaces that have been passivated in accordance with the present invention, they become ohmic, i.e., they display no barriers. This is demonstrative of the powerful effects of surface states and the desirability of removing such states from surfaces on which solid-state devices are constructed.

The present invention involves the application of a passivating agent, also referred to as a passivant, under conditions that allow the passivant to react with a semiconductor surface but not to agglomerate or otherwise condense to form a thicker layer. In one form, this is accomplished by adjusting the temperature and pressure such that the partial pressure of the passivating agent is below the pressure at which it can condense. Under these conditions the passivant may react when it actually contacts the semiconductor substrate and in so doing forms a monolayer of material across the surface. Once the monolayer is complete no further deposition may take place. Since condensation is also precluded, the substrate may only exist in a monolayer passivated form.

The present invention may be used with a variety of passivants of varying valence. For example, the congeners of Groups VI in the periodic table may be used to passivate the silicon (100) surface by bridging between surface atoms and eliminating dangling bonds, dimer bonds and strained back bonds. For other semiconductor surface morphologies such as atomic steps, monovalent materials such as halogens of Group VII and hydrogen and its isotopes may be used to passivate those areas of the semiconductor surface.

Figure 4:
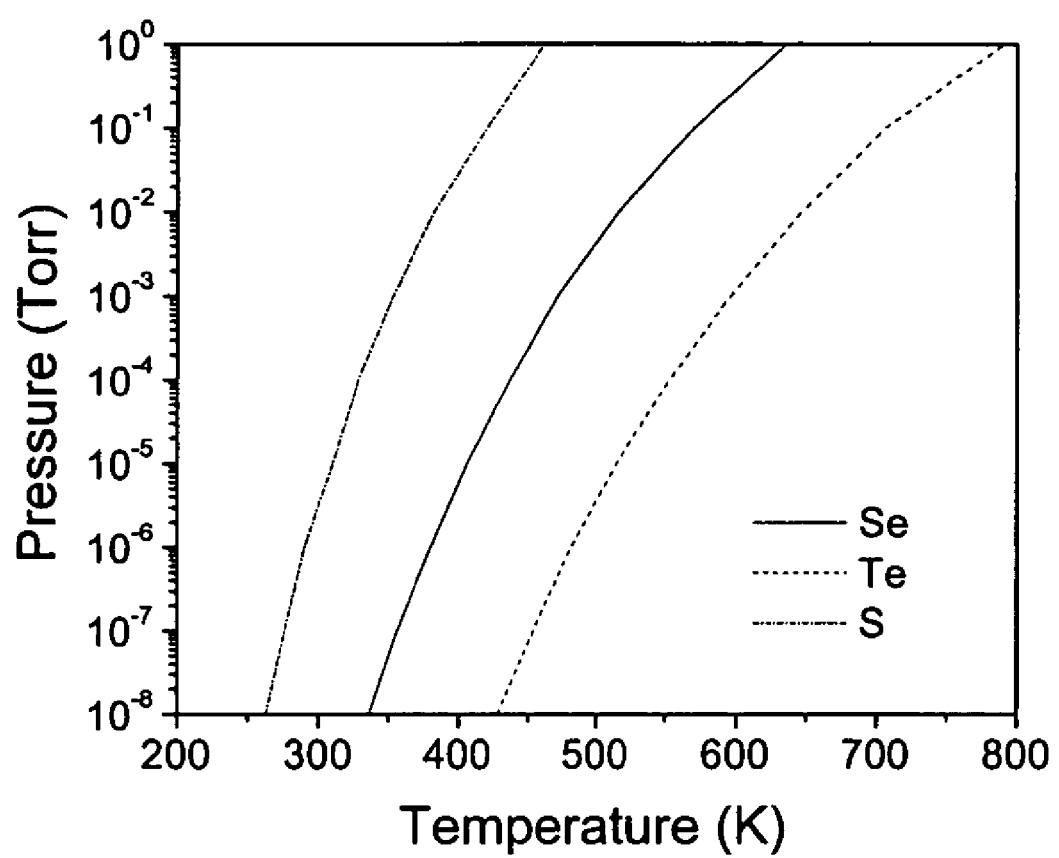
FIG. 4 depicts the phase behavior of sulfur selenium and tellurium as a function of temperature and pressure.

FIG. 4 depicts the known condensation behavior of the Group VI elements, sulfur, selenium and tellurium as a function of pressure and temperature. The line for each element indicates where the condensed and vapor states of the element are in equilibrium with one another. Under conditions to the left of a chosen line in the plot, condensation will occur, and to the right of the same line, the element exists only in its vapor state. The present invention makes use of this data by using conditions where the element only exits in the vapor phase and allowing it to interact with a semiconductor substrate. The gaseous element may only be permanently removed from the vapor phase by contacting the surface and reacting with it. This is how monolayer passivation is accomplished.

The present invention also provides for methods of suppressing the chemical reactivity of a semiconductor surface by eliminating dangling bonds on the surface. As presented herein, this is achieved by passivating one or more dangling bonds with a very thin layer of valence-mending atoms deposited onto the surface. In one embodiment, the thin layer (e.g., monolayer) is precisely one atomic layer.

Suppression of Reactions Between Semiconductors and Metals

When a layer of metal is deposited onto a semiconductor surface, interfacial reactions occur and a compound layer (in this case, the semiconductor is silicon and the compound is a silicide) is formed between metal and semiconductor. This can occur with and without heating, often depending on the reactivity of the particular metal/semiconductor pair. With the present invention, when a layer of metal is deposited onto a valence-mended semiconductor surface, interfacial reactions are suppressed up to a higher temperature and no compound is formed below that temperature.

Deposited metals may include, but are not limited to, titanium, cobalt, nickel, tungsten, molybdenum, platinum, gold, and chromium, of which many are metals commonly used in semiconductor devices. As described, when such metals are in contact with silicon, silicides of different phases and different stoichiometry are formed at the interface (with or without heating). Because suicides may degrade device performance, they are sometimes unwanted. By passivating the semiconductor surface with the method described herein before placing the surface in contact with a metal, interfacial silicide formation is suppressed.

Example of a Suppressed Reaction

Figure 5:
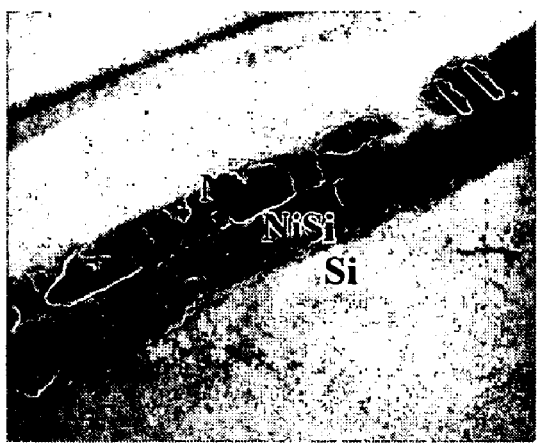
FIG. 5 depicts transmission electron micrographs of interfaces between nickel and silicon (100) annealed at different temperatures, including (A) bare silicon (100) with nickel annealed at 400 degrees Centigrade, (B) bare silicon (100) with nickel annealed at 500 degrees Centigrade, (C) selenium-passivated silicon (100) with nickel annealed at 500 degrees Centigrade, and (D) selenium-passivated silicon (100) with nickel annealed at 600 degrees Centigrade.
Figure 5:
Figure 5:
Figure 5:
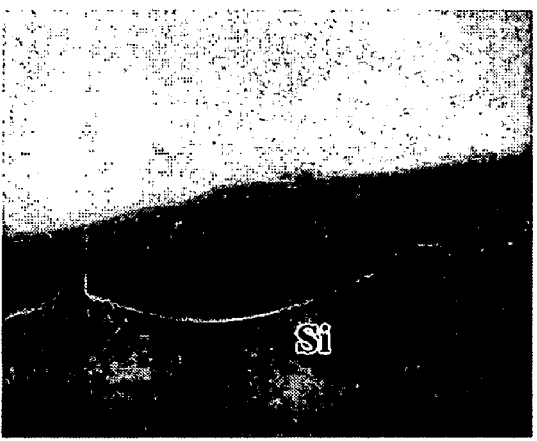

As shown in FIG. 5A, nickel reacts with a silicon (100) surface when heated to 400 degrees Centigrade and forms both nickel subsilicide ($Ni_2Si$) and nickel monosilicide (NiSi). When nickel is in contact with a selenium-passivated silicon (100) surface (FIG. 5C), it resists the formation of either nickel subsilicide or nickel monosilicide when heated to 500 degrees Centigrade. When heated to 600 degrees Centigrade, nickel eventually reacts with the selenium-passivated silicon (100) surface and forms nickel monosilicide, as shown in FIG. 5D. Nickel subsilicide (reactant) was not observed with contacts between nickel and selenium-passivated silicon (100) at temperature ranges of at least about 300-700 degrees Centigrade. Thus, nickel subsilicide ($Ni_2Si$) formation was suppressed and nickel monosilicide (NiSi) was the existent phase between nickel and passivated silicon at temperatures between at least about 300-700 degrees Centigrade. As such, the present invention is capably of suppressing the formation of silicides.

Suppression of Reactions Between Semiconductors and Dielectrics

When a layer of dielectric is deposited onto a semiconductor surface, interfacial reactions often occur, which form a compound between the semiconductor and the dielectric. This compound is sandwiched between the semiconductor and the dielectric, and often degrades the dielectric/semiconductor interface. With the present invention, when a layer of dielectric is deposited onto a valence-mended semiconductor surface, interfacial reactions just described were suppressed. Therefore, by passivating the semiconductor surface with the method described herein before putting the surface in contact with dielectrics, the formation of an interfacial compound is suppressed. The suppression generally occurs at a range of temperatures, such that an interfacial compound is not formed within this temperature range. For example, between hafnium dioxide ($HFO_2$) and silicon, the selenium-passivated silicon (100) surface can withstand temperatures up to 450 degrees Centigrade.

Example of a Suppressed Interfacial Reaction

Several dielectric materials with high dielectric constants (the so-called high-k dielectrics, with k (dielectric constant) larger than 4 are thought to be useful for next-generation complimentary metal-oxide-semiconductor (CMOS) devices. These materials include hafnium dioxide ($HfO_2$), zirconium dioxide ($ZrO_2$), and their silicates and aluminates, as examples. These materials will replace current dielectrics in CMOS devices, such as silicon dioxide ($SiO_2$) or silicon oxynitride ($SiO_xN_y$), compounds that have lower dielectric constants (k~4).

A common problem for these high-k dielectrics when deposited onto a silicon surface is the occurrence of interfacial reactions between silicon and high-k dielectrics. The interfacial reaction generally forms an interfacial oxide layer with a lower dielectric constant. The low-k dielectric defeats the very purpose of utilizing high-k dielectrics. With the present invention, the deposit of a high-k dielectric on a valence-mended silicon surface suppressed the formation of interfacial oxide and a thin high-k dielectric layer was obtained. We have prepared a high-k dielectric, hafnium dioxide, on selenium-passivated silicon (100) and heated it to 600 degrees Centigrade. Electrical measures proved that there were no interfacial reactions between the dielectric and silicon up to 400 degrees Centigrade. As a comparison, hafnium dioxide was also prepared on non-passivated silicon (100) and interfacial reactions were observed at 200-300 degrees Centigrade.

Suppression of Chemical Reactions on Semiconductor Surfaces

The present invention is also used to illustrate that a valence-mended semiconductor surface suppresses chemical reactions on that surface. When a bare semiconductor surface is exposed to air, it chemically adsorbs various species in air: oxygen ($O_2$), carbon dioxide ($CO_2$), carbon monoxide (CO), water vapor ($H_2O$), etc. After adsorption, the semiconductor surface is covered with a thin layer of adsorbates that consist of species such as oxygen and carbon.

With the present invention, a valence-mended semiconductor surface has no dangling bonds on the surface. When such a valence-mended semiconductor surface is exposed to air, it physically adsorbs various species in air; however, the physical adsorbates are only weakly bonded to such a surface. Upon heating of this surface, even at relatively low temperatures of at least about 100-500 degrees Centigrade, the physical adsorbates were found to desorb and the surface was clean from carbon and oxygen. In comparison, chemical adsorbates (such as occurs with non-valence-mended semiconductor surfaces) required much higher temperatures to desorb.

The above shows that when a passivated silicon surface is exposed to air, chemical adsorption is suppressed and only physical adsorption is present on the surface. This physical adsorption is desorbed by heating the surface to relatively low temperatures (at least about 100-500 degrees Centigrade) and a clean silicon surface is obtained without high-temperature heating (e.g., above 600 degrees Centigrade).

Example of Maintaining a Clean Silicon Surface

Common adsorbates on a silicon (100) surface include oxygen and carbon. On a selenium-passivated silicon (100) surface, physically adsorbed oxygen and carbon were desorbed by heating the surface to a relatively low temperature, often below a temperature of at least about 500 degrees Centigrade. On a bare silicon (100) surface, chemically adsorbed oxygen and carbon required a much higher temperature to desorb, often above 900 degrees Centigrade.

Therefore, a passivated silicon surface when exposed to oxygen or water vapor at elevated temperatures does not lead to the formation of $SiO_2$ (it is suppressed such that the surface remains free of $SiO_2$). This is contrasted to a non-passivated or normal silicon surface that will have $SiO_2$ on its surface after a similar exposure to oxygen or water vapor.

Example of Preventing a Silicon Surface from Oxidation

When a bare silicon surface was exposed to oxygen or water vapor at elevated temperatures, i.e., above room temperature, a thin layer of silicon dioxide ($SiO_2$) was formed on the surface. When a valence-mended silicon surface was exposed to oxygen or water vapor at elevated temperatures, the formation of $SiO_2$ was suppressed and the surface remained free of $SiO_2$. This suppression generally occurred up to a certain temperature, about 500 degrees Centigrade.

The present invention reveals several methods of reducing chemical reactivity of semiconductor surfaces. Such methods have numerous applications, such as (a) the suppression of interfacial reactions between silicon and dielectrics with high dielectric constants; (b) the suppression of interfacial reactions between silicon and metals, and (c) the suppression of surface reactions on semiconductor surfaces. The present invention also provides for a method that keeps a semiconductor surface clean.

Preparative Examples of Valence Mending

Various features of the present invention take advantage of a method of preparing a monolayer of valence-mending atoms on a semiconductor surface. Generally, the monolayer is precisely one atomic layer. Examples are provided for a metal/silicon (100) interface with a monolayer of selenium. As described herein, low Shottky barriers were obtained on n-type silicon (100), and a negative Schottky barrier was demonstrated on n-type silicon (100) with a metal, such as magnesium or titanium.

Figure 6:
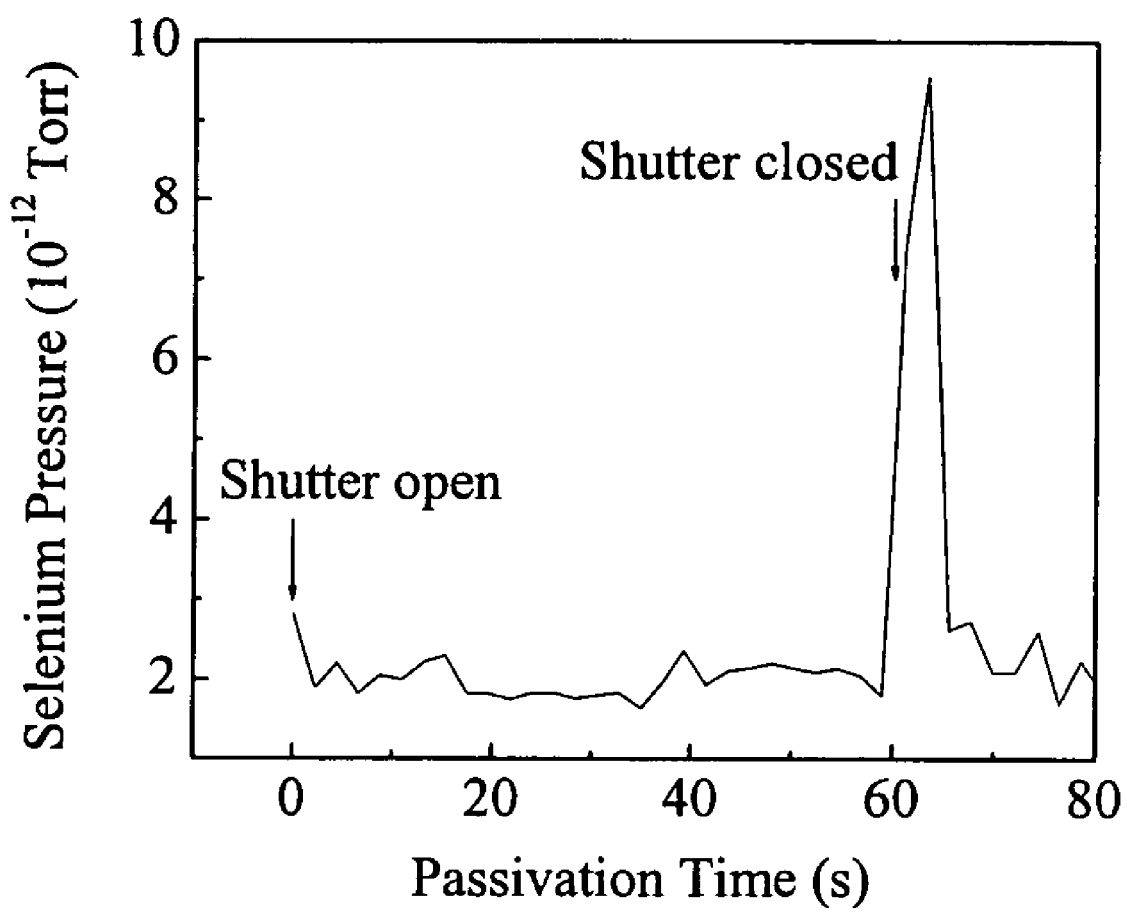
FIG. 6 depicts an observed pressure of selenium during the passivation of silicon (100) by molecular beam epitaxy in accordance with the present invention.

FIG. 6 graphically depicts a passivant reacting with a semiconductor surface until all of the reaction sites on the surface are passivated. With a molecular beam epitaxy (MBE) system, the shutter to a selenium source was opened at time 0 in the plot. The pressure of selenium in the reaction chamber remained low for approximately 60 seconds, indicating that the selenium was reacting with the surface and not building up in the reactor. At approximately 60 seconds, there was a spike in selenium pressure indicating that all of the reactive site on the surface of the silicon (100) wafer were passivated, and all additional selenium that was added was merely surplus and building up as a gas in the reaction chamber.

N-type silicon (100) wafers were used with antimony doping levels in the low $10^{15}$ cm$^{-3}$. The nominal wafer miscut was less than 0.5 degrees. The selenium passivation experiments were performed in two molecular beam epitaxy (MBE) systems connected through an ultrahigh vacuum transfer tube. One of them was for silicon growth and the other for selenium passivation. The wafers were cleaned in 2% hydrofluoric acid for 30 seconds before loaded into the silicon MBE system. Silicon buffer layers of 500 Å with residual antimony doping levels of mid-$10^{14}$ cm$^{-3}$ were grown at about 600 degrees Centigrade and then annealed at about 800 degrees Centigrade for 1 hour. Sharp 2×1 reconstruction was always obtained with reflection high-energy electron diffraction after annealing. Some wafers were unloaded after silicon buffer growth. Other wafers were transferred to the selenium MBE system for passivation. The selenium source temperature was about 224 degrees Centigrade, the passivation time was 60 seconds, and the silicon wafer temperature was 300 degrees Centigrade. Under the conditions described, precisely one monolayer of selenium was deposited on the silicon (100) surface.

After passivation, metal-silicon contacts were fabricated by electron-beam evaporation and lift-off on selenium-passivated wafers without any cleaning. The metal (such as magnesium) dots were approximately 290 µm in diameter. Metal-silicon contacts were also fabricated on silicon wafers with 500 Å silicon buffer but without selenium passivation. Heating of the metal-silicon contacts was performed with rapid thermal annealing and hot plate.

Figure 7:
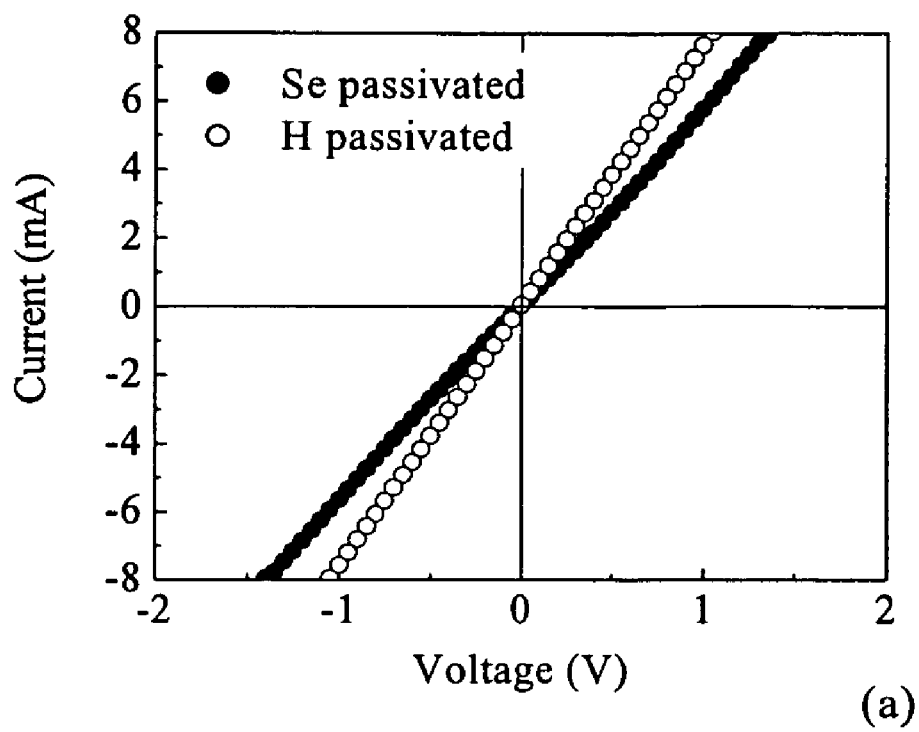
FIG. 7 depicts a current-voltage characteristic of (a) as-deposited magnesium contacts and (b) annealed magnesium contacts at 300 degrees Centigrade in an nitrogen ambient for 30 seconds.
Figure 7:
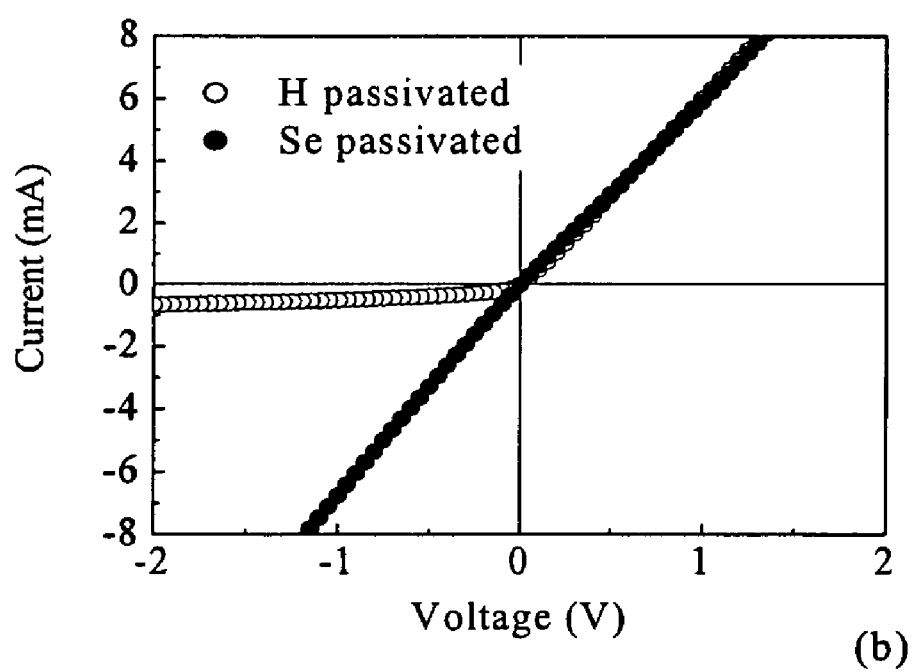

Magnesium is known to form a Schottky contact with n-type silicon (100) with a barrier height of 0.4 eV. FIG. 7(a) shows the current-voltage (I-V) characteristics of magnesium contacts on hydrogen-passivated and selenium-passivated silicon (100), without heating, both of which behave in an ohmic fashion. In fact, ohmic behavior is observed for magnesium contacts on hydrogen-passivated and selenium-passivated silicon (100) with n-type doping levels from low $10^{14}$ cm$^{-3}$ to high $10^{18}$ cm$^{-3}$.

Figure 8:
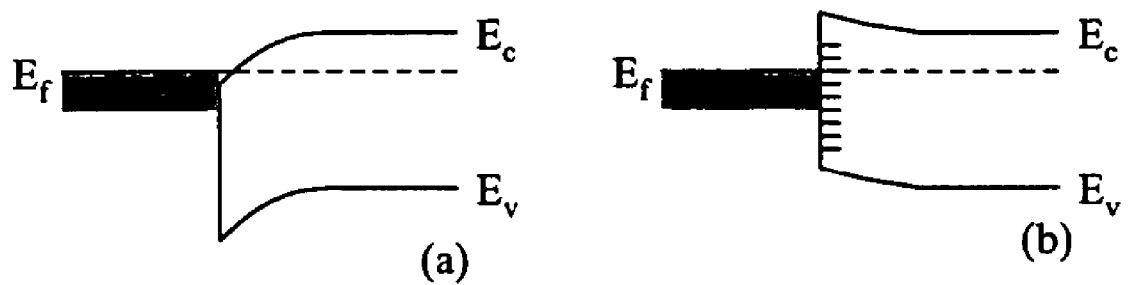
FIG. 8 is a band diagram of magnesium-silicon contacts (A) without interface states and (b) with interface states.

The work function, $\phi$, of magnesium is 3.66 eV, and the electron affinity, $\chi$, of silicon is 4.05 eV. The ideal Schottky barrier height, $\phi_B$, for a magnesium-silicon contact free of interface states is $\phi_B=\phi-\chi$, which results in a negative barrier height of –0.39 eV. The negative sign simply means that there is no energy barrier between magnesium and silicon, as shown in FIG. 8(a). In reality, interface states often pin the interface Fermi level, consistent with the band diagram in FIG. 8(b). Several metals, including most of the Groups I and II elements, can have the band diagram shown in FIG. 8(a) with silicon, if only their work functions are considered. However, interface states are so dominant between these materials and silicon that such behavior is typically not observed.

Ohmic behavior is expected for the band diagram in FIG. 8(a). For electrons drifting from magnesium-silicon in FIG. 8(a), there is a small energy hump that is typically less than a few tenths of an electron volt. Once the applied voltage exceeds it, the contact becomes completely ohmic. In many cases, they behave perfectly ohmic.

Ohmic behavior is also observed for magnesium contacts on hydrogen-passivated silicon (100), as shown in FIG. 7(a). It is believed that hydrogen passivation also reduces surface states and produces the band diagram in FIG. 8(a).

The behavior of these samples after heating is noteworthy. FIG. 7(b) shows the I-V characteristics of magnesium contacts on hydrogen-passivated and selenium-passivated silicon (100) after rapid thermal annealing at 300 degrees Centigrade for 30 seconds in a nitrogen ambient. While the selenium-passivated sample remains ohmic, the hydrogen-passivated sample turns into a Schottky contact. Selenium passivation produces a more stable surface than hydrogen passivation. This is significant because a number of heating steps are often required in the manufacture of complex semiconductor devices.

A first-principle analysis of surface energetics, accomplished by counting dangling bonds and taking into account bond dissociation energies, indicates that the selenium-passivated silicon (100) surface in FIG. 2(b) is $2.1\times10^{-4}$ cal/cm$^2$ lower in energy than the hydrogen-passivated silicon (100): 2×1 surface. It is likely that hydrogen passivation breaks down and magnesium reacts with silicon to form magnesium silicide at 300 degrees Centigrade. A Schottky contact is then formed between silicon and magnesium silicide. For the selenium-passivated sample, silicide formation is suppressed and the interface remains a magnesium-silicon one at 300 degrees Centigrade.

Figure 9:
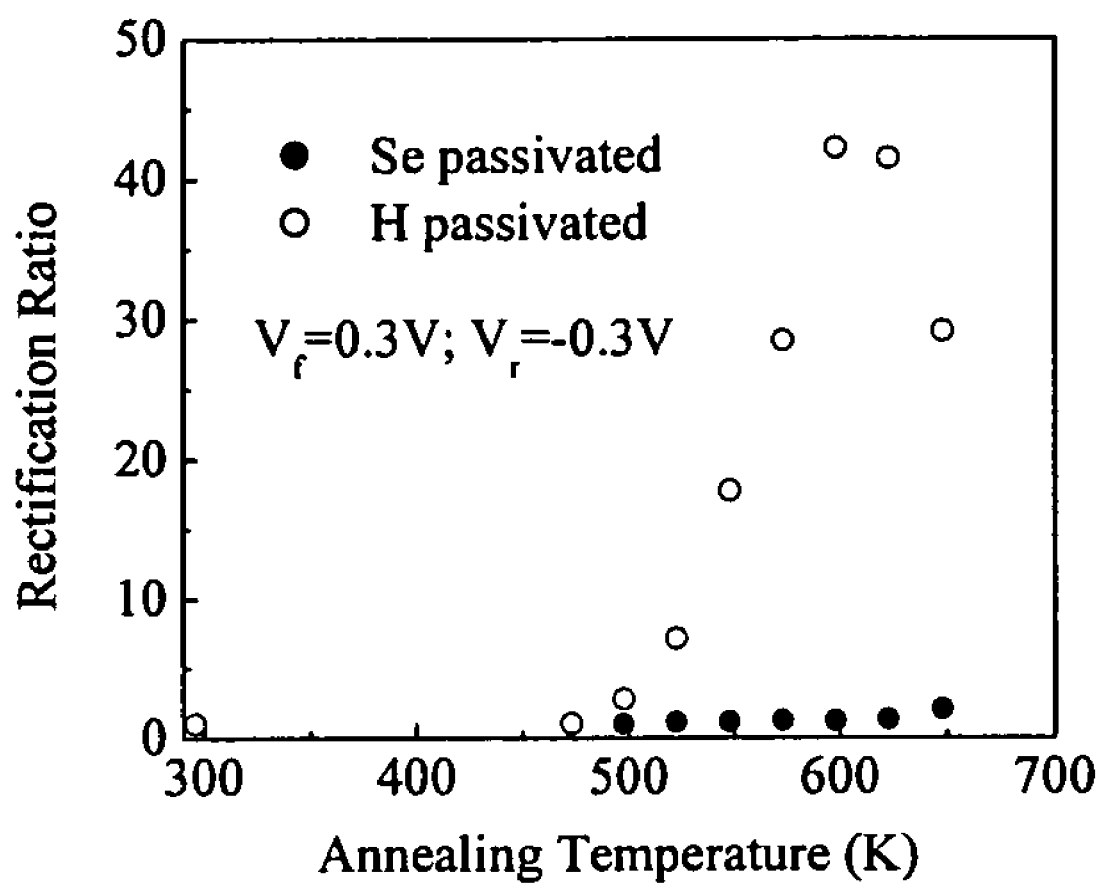
FIG. 9 is a rectification ratio ($I_f/I_r$ at V=±0.3 V) as a function of annealing temperature for magnesium contacts on hydrogen-passivated and selenium-passivated silicon (100).

To quantify the transition from ohmic to Schottky, the rectification ratio, i.e., the ratio of the forward current, $I_f$, at forward voltage $V_f=0.3$ V and the reverse current, $I_r$, at reverse voltage $V_r=-0.3$ V is plotted as a function of hot-plate annealing temperature in FIG. 9 for both hydrogen-passivated and selenium-passivated silicon (100) samples. On these samples the magnesium contacts are capped with 500 Å nickel (Ni) to prevent magnesium oxidation during heating. The ratio for hydrogen-passivated samples starts to rise rapidly from ~1 at ~225 degrees Centigrade (500 K) and saturates to ~40 at ~325 degrees Centigrade (600 K). For the selenium-passivated sample, the ratio stays at ~1 even at 375 degrees Centigrade (650 K). Annealing above 375 degrees Centigrade is difficult because even the nickel-magnesium contacts get oxidized above that temperature. It is believed that, when the annealing temperature is high enough, magnesium and selenium-passivated silicon (100) will eventually react to form magnesium silicide, and its rectification ratio will eventually increase to a value comparable to 40. If the middle point of the rectification ratio, 20, is defined as the transition temperature from ohmic to Schottky, selenium-passivated silicon (100) has a transition temperature that is more than 100 degrees Centigrade higher than that of hydrogen-passivated silicon (100) in FIG. 9. However, the same characterization has been performed on multiple samples, and the statistics indicates that the transition temperature for hydrogen-passivated samples are consistently between 275-300 degrees Centigrade, and that temperature for selenium-passivated samples fluctuates from 300 degrees Centigrade to above 375 degrees Centigrade.

In one form, a method for passivating a semiconductor surface with a thin layer or monolayer of a passivating agent (capable of providing valence-mending atoms) includes the steps of placing a semiconductor substrate, having at least one surface in a chamber, and heating the semiconductor substrate to a temperature. The semiconductor substrate is then exposed to a passivating agent for a period of time sufficient to react with substantially all of the surface, and the partial pressure of the passivating agent is such that the passivating agent will not condense at the temperature of the substrate. As a result of this treatment the presence of surface states is greatly reduced and one atomic layer of valence-mending atoms is formed on the semiconductor surface.

In another form, a method for manufacture of a semiconductor device with a low Schottky barrier includes the steps of placing an p-type semiconductor substrate having at least one surface in a chamber and heating the semiconductor substrate to a temperature. The semiconductor substrate is then exposed to a passivating agent (capable of providing valence-mending atoms) for a period of time sufficient to react with substantially all of the surface, and the partial pressure of the passivating agent is such that the passivating agent will not condense at the temperature of the substrate. As a result of this treatment the presence of surface states is greatly reduced and one atomic layer of valence-mending atoms is formed on the semiconductor surface. A portion of the semiconductor surface is then metallized with a metal having a work function whose magnitude is slightly greater than the magnitude of the electron affinity and the band gap of the p-type semiconductor substrate.

In still another form, a method for manufacture of a semiconductor device with a low Schottky barrier includes the steps of placing a p-type semiconductor substrate having at least one surface in a chamber and heating the semiconductor substrate to a temperature. The semiconductor substrate is then exposed to a passivating agent (capable of providing valence-mending atoms) for a period of time sufficient to react with substantially all of the surface, and the partial pressure of the passivating agent is such that the passivating agent will not condense at the temperature of the substrate. As a result of this treatment the presence of surface states is greatly reduced and one atomic layer of valence-pending atoms is formed on the semiconductor surface. A portion of the semiconductor surface is then metallized with a metal having a work function whose magnitude is slightly less than the sum of the magnitude of the electron affinity and the band gap of the p-type semiconductor substrate.

In still another form, a method for manufacture of a semiconductor device with improved ohmic contacts comprises the steps of placing an n-type semiconductor substrate having at least one surface in a chamber and heating the semiconductor substrate to a temperature. The semiconductor substrate is then exposed to a passivating agent (capable of providing valence-mending atoms) for a period of time sufficient to react with substantially all of the surface, and the partial pressure of the passivating agent is such that the passivating agent will not condense at the temperature of the substrate. As a result of this treatment the presence of surface states is greatly reduced and one atomic layer of valence-mending atoms is formed on the semiconductor surface. A portion of the semiconductor surface is then metallized with a metal having a work function whose magnitude is less than the magnitude of the electron affinity of the n-type semiconductor substrate.

In yet another form, a method for manufacture of a semiconductor device with improved ohmic contacts includes the steps of placing a p-type semiconductor substrate having at least one surface in a chamber and heating the semiconductor substrate to a temperature. The semiconductor substrate is exposed to a passivating agent (capable of providing valence-mending atoms) for a period of time sufficient to react with substantially all of the surface, and the partial pressure of the passivating agent is such that the passivating agent will not condense at the temperature of the substrate. As a result of this treatment the presence of surface states is greatly reduced and one atomic layer of valence-mending atoms is formed on the semiconductor surface. A portion of the semiconductor surface is then metallized with a metal having a work function whose magnitude is greater than the sum of the magnitude of the electron affinity and the band gap of the p-type semiconductor substrate.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed is:

1. A semiconductor surface free of interfacial reactions between the surface and a second molecular species comprising:
   a semiconductor surface with one atomic layer of valence-mending atoms and a second molecular species, wherein the valence-mending atoms comprise atoms that create a second surface on the one atomic layer and in contact with the second molecular species, the second surface without dangling bonds and free of interfacial reactions and wherein the semiconductor surface is a silicon (100) surface.

2. The semiconductor surface of claim 1, wherein the second molecular species is selected from the group consisting of metals, dielectrics, dielectric precursors, metal oxides, oxygen, water vapor, carbon, hydrogen, carbon dioxide, carbon monoxide, and combinations thereof.

3. The semiconductor surface of claim 2, wherein the dielectric and dielectric precursor is a high dielectric constant material with a dielectric constant larger than 4.

4. The semiconductor surface of claim 1, wherein the valence mending atoms are from passivating the semiconductor surface from a passivating agent, the passivating agent containing an agent selected from the group consisting of a Group VI congener, a Group VII congener, and hydrogen.

5. The semiconductor surface of claim 4, wherein the passivating agent is temperature sensitive.

6. The semiconductor surface of claim 5, wherein a temperature below 700 degrees Centigrade prevents interfacial reactions.

7. The semiconductor surface of claim 4, wherein the passivated surface is temperature sensitive.

8. The semiconductor surface of claim 1, wherein interfacial reactions are selected from the group consisting of oxidation, chemical adsorption silicidation, and combinations, thereof.

* * * * *